(12) United States Patent
Seler et al.

(10) Patent No.: US 10,037,900 B1
(45) Date of Patent: Jul. 31, 2018

(54) UNDERFILL STOP USING VIA BARS IN SEMICONDUCTOR PACKAGES

(71) Applicant: NXP B.V., Eindhoven (NL)

(72) Inventors: Ernst Seler, Munich (DE); Jorn Isaksen, Munich (DE); Shamsuddin Ahmed, Munich (DE); Ralf Reuter, Landshut (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/590,757

(22) Filed: May 9, 2017

(51) Int. Cl.
| | |
|---|---|
| *H01L 23/02* | (2006.01) |
| *H01L 21/56* | (2006.01) |
| *H01L 23/31* | (2006.01) |
| *H01L 21/48* | (2006.01) |
| *H01L 23/50* | (2006.01) |
| *H01L 23/00* | (2006.01) |

(52) U.S. Cl.
CPC ........ *H01L 21/563* (2013.01); *H01L 21/4853* (2013.01); *H01L 23/3178* (2013.01); *H01L 23/50* (2013.01); *H01L 24/14* (2013.01); *H01L 24/17* (2013.01); *H01L 2224/73204* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 6,331,446 B1 | 12/2001 | Cook et al. | |
| 2013/0299995 A1* | 11/2013 | Lee | H01L 21/563 257/774 |
| 2017/0141050 A1* | 5/2017 | Jang | H01L 23/562 |

FOREIGN PATENT DOCUMENTS

GB 2 405 533 A 3/2005

* cited by examiner

*Primary Examiner* — Bradley K Smith
(74) *Attorney, Agent, or Firm* — Rajeev Madnawat

(57) ABSTRACT

A device is disclosed. The device includes a baseboard including a first set of metallic contact pads, a semiconductor integrated chip (IC) package including a second set of metallic contact pads and metallic interconnects to connect the first set of metallic contacts pads and the second set of metallic contact pads through metallic interconnects. The second set of metallic contact pads includes a first group of contact pads and a second group of contact pads. The first group of contact pads are designed to carry a high frequency signal. The baseboard includes a plurality of holes that at least partially segregates a first group of metallic interconnects that connects the first group of contact pads to the baseboard and a second group of metallic interconnects that connects the second group of contact pads to the baseboard.

7 Claims, 2 Drawing Sheets

US 10,037,900 B1

UNDERFILL STOP USING VIA BARS IN SEMICONDUCTOR PACKAGES

BACKGROUND

Conventionally, semiconductor chip packaging includes metallic pins that are then inserted into holes in a printed circuit board (PCB) and the pins are soldered therein. However, ever increasing density of components on PCBs and decreasing overall size of devices have prompted the use of a different type of packaging, such as Wafer Level Chip Scale Packaging (WLCSP) or Embedded Wafer Level Ball (eWLB), that does not include metallic pins. Instead, metallic contacts are left on the bottom of the integrated circuit packaging during the manufacturing process of the integrated circuit and or packaging thereof. These metallic contacts are then electrically connected to corresponding metallic contacts on a PCB using solder balls to form a device or a system. To increase mechanic strength and solder joint reliability, a non-conductive underfill compound is filled and solidified between the integrated circuit package and the PCB.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device is disclosed. The device includes a baseboard including a first set of metallic contact pads, a semiconductor integrated chip (IC) package including a second set of metallic contact pads and metallic interconnects to connect the first set of metallic contacts pads and the second set of metallic contact pads through metallic interconnects. The second set of metallic contact pads includes a first group of contact pads and a second group of contact pads. The first group of contact pads are designed to carry a high frequency signal. The baseboard includes a plurality of holes that at least partially segregates a first group of metallic interconnects that connects the first group of contact pads to the baseboard and a second group of metallic interconnects that connects the second group of contact pads to the baseboard.

In some embodiments, frequency of the high frequency signal is above 1 giga hertz and the first group of contact pads is located on one side of the semiconductor IC package while the second group of contact pads is located on the opposing side. A non-conducting compound is at least partially filled between the baseboard and the semiconductor IC package. The non-conducting compound is filled from a side where the second group of contact pads are located at. In another embodiment, the second group of contact pads surrounds the first group of contact pads. In this embodiment, the non-conducting compound is at least partially filled between the baseboard and the semiconductor IC package and the non-conducting compound is filled from at least two directions.

In some embodiments, the diameter of each of the plurality of holes depends of viscosity of the non-conducting compound at a temperature at which the non-conducting compound is inserted between the baseboard and the semiconductor IC package. In some embodiments, the diameter of each of the plurality of holes is smaller than a diameter of a metallic interconnect in the first group of metallic interconnects.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Typically, filling the space between a semiconductor integrated circuit (IC) package and a mounting base such as a printed circuit board (PCB) with an adhesive non-conducting compound provides sturdiness to the combination and provides a better solder ball joint reliability. However, if the semiconductor IC package is designed to operate at high frequencies, the underfill compound stuck to the solder balls causes a decreased performance due to higher transmission losses and added impedance mismatch.

In the embodiments described herein, the interconnects (e.g., solder balls) that carry radio frequency signals or high frequency signals (especially in giga hertz range) are segregated and at least partially surrounded by holes in the PCB or mounting baseboard. The holes may or may not go through the entire thickness of the PCB or mounting baseboard.

Figure 1:
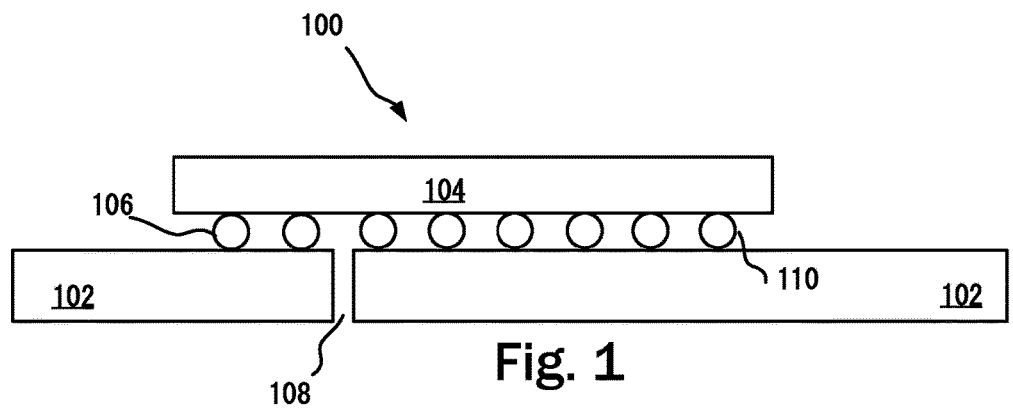
FIGS. 1 to 4 depict an integrated circuit mounted on a printed circuit board having high frequency contacts on one side in accordance with one or more embodiments of the present disclosure.

FIG. 1 depicts at least a partial cross section of a device 100 that includes a mounting baseboard 102 on which a semiconductor IC package 104 is mounted and electrically connected through solder balls or metallic interconnects 110, 106. Solder balls 110 do not operate at high frequencies whereas solder balls 106 operate at high frequency. Also shown is a hole or via 108 between the high frequency and non-high frequency solder balls.

Figure 2:
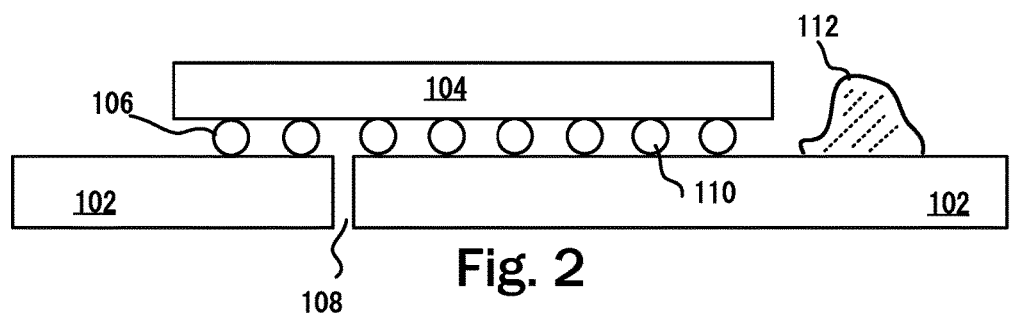

FIG. 2 displays the same device 100 of FIG. 1. During the manufacturing or mounting process, after mounting the semiconductor IC package 104 on the baseboard 102, a non-conductive adhesive compound 112 is deposited in the proximity of the semiconductor IC package. The compound 112 is typically semi-solid at a first temperature and its viscosity decreases at a second temperature that is higher than the first temperature. When the temperature is increased above the second temperature, the viscosity of the compound 112 decreases and the compound 112 starts to flow in between the semiconductor IC package 104 and the baseboard 102. When the temperature returns to the first temperature or approximately the first temperature, the compound 112, now in between the semiconductor IC package 104 and the baseboard 102 solidifies. In some embodiments, a compound that is generally semisolid at lower temperatures and solidifies at higher temperatures may also be used.

Figure 3:
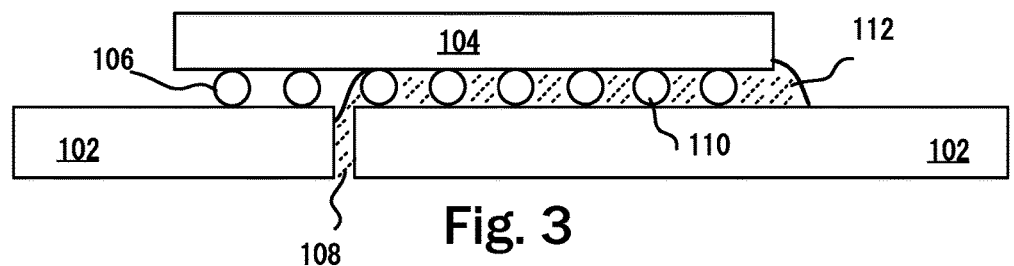

As depicted in FIG. 3, when the compound 112 is flowing between the semiconductor IC package 104 and the baseboard 102, the via 108 provides a drainage to remove the compound 112 from flowing further so that the high frequency solder balls or interconnects 106 stay without a compound covering.

Figure 4:
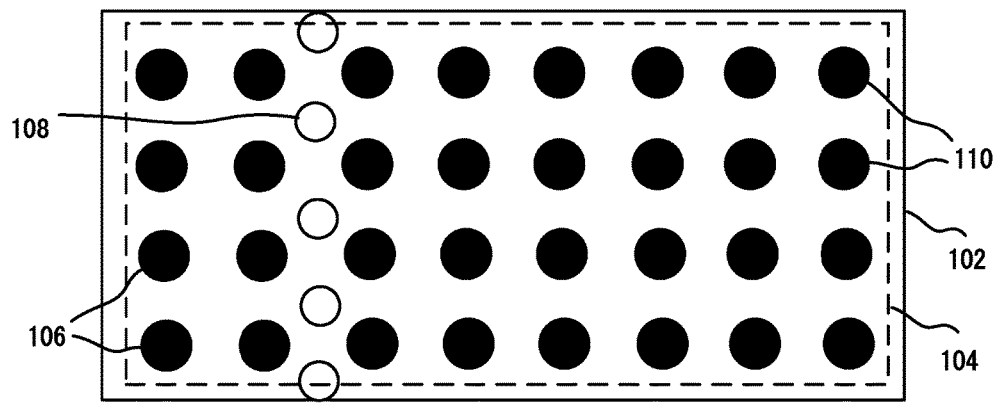

FIG. 4 shows the device 100 in a plan view to show an arrangement of vias or holes 108 between the high frequency solder balls 106 and the non-high frequency solder balls 110. In some embodiments, the location of these holes or via 108 is oriented such that the holes 108 are not aligned in straight line with the solder balls 110 and the high frequency solder balls 106 because to be more effective the holes 108 should be in the channel in between the rows of solder balls 110, 106 because the compound 112 flows in that channel. In some embodiments, the diameter of a hole 108 may be smaller than the diameter of a solder ball 110 or 106. The diameter of the hole 108 may also depends on the viscosity of the compound 112 at the second temperature.

Figure 5:
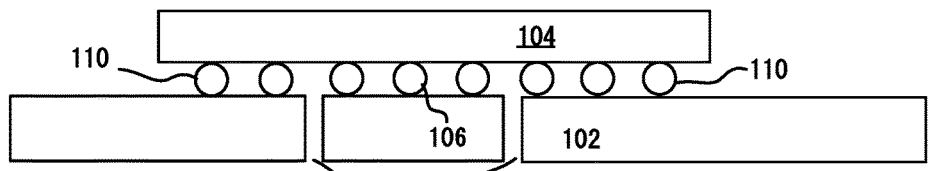
FIGS. 5 and 6 depict an integrated circuit mounted on a printed circuit board having high frequency contacts in the middle in accordance with one or more embodiments of the present disclosure.
Figure 6:
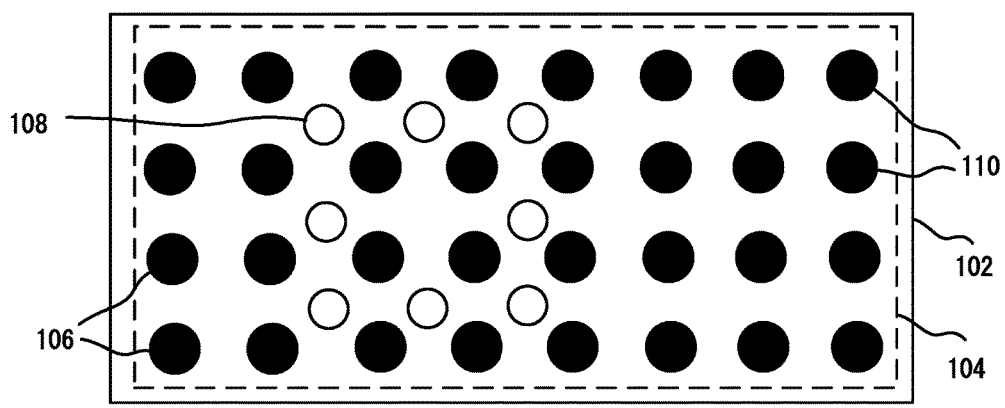

FIGS. 5 and 6 displays the system 100 in another embodiment in which the high frequency interconnects or solder balls 106 are not on one side of the semiconductor IC package 104, instead the high frequency solder balls 106 are somewhere in the middle while the non-high frequency solder balls 110 located on both or all sides of the high frequency solder balls 106. In such embodiments, the holes 108 are positioned to at least partially segregate the high frequency solder balls 106 such that the compound 112 flow can be restricted from reaching the high frequency solder balls 106. In such embodiments, the compound 112 may be inserted between the semiconductor IC package 104 and the baseboard 102 from two or more directions.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device, comprising:
    a baseboard including a first set of metallic contact pads and a plurality of holes;
    a semiconductor integrated chip (IC) package including a second set of metallic contact pads; and
    metallic interconnects to connect the first set of metallic contact pads and the second set of metallic contact pads through metallic interconnects, wherein the second set of metallic contact pads includes a first group of contact pads on a first side of the semiconductor integrated chip (IC) package and a second group of contact pads on a first side of the semiconductor integrated chip (IC) package, the first side opposite the second side, the second group of contact pads surrounding the first group of contact pads, the first group of contact pads are configured to carry a frequency signal in a Gigahertz range, and the plurality of holes isolate on all sides a first group of metallic interconnects that connects the first group of contact pads to the baseboard from a second group of metallic interconnects that connects the second group of contact pads to the baseboard.

2. The device of claim 1, wherein a non-conducting compound is at least partially filled between the baseboard and the semiconductor IC package.

3. The device of claim 2, wherein the non-conducting compound is filled from a side where the second group of contact pads are located at.

4. The device of claim 2, wherein a diameter of each of the plurality of holes depends upon viscosity of the non-conducting compound at a temperature at which the non-conducting compound is inserted between the baseboard and the semiconductor IC package.

5. The device of claim 2, wherein a diameter of each of the plurality of holes is smaller than a diameter of a metallic interconnect in the first group of metallic interconnects.

6. The device of claim 1, wherein a non-conducting compound is at least partially filled between the baseboard and the semiconductor IC package.

7. The device of claim 6, wherein the non-conducting compound is filled from at least two directions.

\* \* \* \* \*